United States Patent
Terashima

(10) Patent No.: US 8,120,107 B2
(45) Date of Patent: Feb. 21, 2012

(54) SEMICONDUCTOR DEVICE INTERNALLY HAVING INSULATED GATE BIPOLAR TRANSISTOR

(75) Inventor: Tomohide Terashima, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 13/005,900

(22) Filed: Jan. 13, 2011

(65) Prior Publication Data

US 2011/0108882 A1   May 12, 2011

Related U.S. Application Data

(62) Division of application No. 12/480,298, filed on Jun. 8, 2009, now Pat. No. 7,898,029.

(30) Foreign Application Priority Data

Dec. 17, 2008 (JP) ................................. 2008-321466

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl. ........ 257/340; 257/369; 257/394; 257/139; 257/630; 257/E29.197

(58) Field of Classification Search .................. 257/340, 257/394, 630, E29.197, 139
See application file for complete search history.

(56) References Cited

U.S. PATENT DOCUMENTS

| 6,949,797 B2 | 9/2005 | Krumbein et al. |
| 2003/0205765 A1* | 11/2003 | Masuoka ....................... 257/369 |

FOREIGN PATENT DOCUMENTS

| JP | 61-248459 | 11/1986 |
| JP | 5-55204 | 3/1993 |
| JP | 6-132525 | 5/1994 |
| JP | 6-196553 | 7/1994 |
| JP | 8-111508 | 4/1996 |
| JP | 8-306880 | 11/1996 |
| JP | 11-354657 | 12/1999 |
| JP | 2000-100932 | 4/2000 |
| JP | 2003-158269 | 5/2003 |
| JP | 2005-109394 | 4/2005 |
| JP | 2006-66692 | 3/2006 |
| JP | 2006-324375 | 11/2006 |
| JP | 2008-85307 | 4/2008 |
| JP | 2009-290070 | 12/2009 |

OTHER PUBLICATIONS

Japanese Office Action issued May 10, 2011, in Patent Application No. 2008-321466 (with English-language translation).

* cited by examiner

*Primary Examiner* — Thien F Tran
(74) *Attorney, Agent, or Firm* — Oblon, Spivak, McClelland, Maier & Neustadt, L.L.P.

(57) ABSTRACT

The semiconductor device includes a P-type semiconductor region and an MOS transistor. MOS transistor includes a gate electrode, a collector electrode, a drain electrode, an N-type impurity region and a P-type impurity region. N-type impurity region is electrically connected to the drain electrode. P-type impurity region is electrically connected to the collector electrode. P-type impurity region is electrically connected to the drain electrode. The semiconductor device further includes an N-type impurity region and an electrode. N-type impurity region is electrically connected to the gate electrode. The electrode is formed on the P-type semiconductor region with an insulating film therebetween, and is electrically connected to gate electrode. Thereby, an element footprint can be reduced while maintaining characteristics.

2 Claims, 6 Drawing Sheets

SEMICONDUCTOR DEVICE INTERNALLY HAVING INSULATED GATE BIPOLAR TRANSISTOR

CROSS-REFERENCE TO RELATED APPLICATIONS

This application is a division of and claims the benefit of priority under 35 U.S.C. §120 from U.S. Ser. No. 12/480,298 filed Jun. 8, 2009, the entire contents of which are incorporated herein by reference. U.S. Ser. No. 12/480,298 filed Jun. 8, 2009 claims the benefit of priority under 35 U.C.S. §119 from Japanese Patent Application No. 2008-321466 filed Dec. 17, 2008.

BACKGROUND OF THE INVENTION

1. Field of the Invention

The invention relates to a semiconductor device, and particularly to a semiconductor device having a P-channel MOS transistor (insulated gate field-effect transistor) arranged for improving turn-off characteristics of an IGBT (Insulated Gate Bipolar Transistor). More particularly, the invention relates to a structure of the semiconductor device internally having the IGBT.

2. Description of the Background Art

The IGBT (Insulated Gate Bipolar Transistor) has been known as a power device handling a large electric power. The IGBT can operate as an equivalent circuit controlling the base current of the bipolar transistor by an MOS transistor. The IGBT has both a feature of implementing fast switching characteristics of the MOS transistor and a feature of implementing high-voltage/large-current processing capability of the bipolar transistor.

In the IGBT, a low on-state voltage and a low switching loss are required for reducing a power loss. Generally, in a turn-on operation of the IGBT, holes of minority carriers are injected from a P-type collector layer into an N-type base layer (drift layer), and a resistance of the drift layer lowers due to a conductivity modulation of an N-drift layer. When the resistance of the N-drift layer (drift layer) lowers, many electrons are injected from an emitter layer to the N-drift layer and the IGBT rapidly changes to the on state.

In the on state, a collector-emitter voltage (on-state voltage) is substantially applied to this N-type base layer. For reducing this on-state voltage, a majority carrier current in the drift layer may be increased to lower a resistance value of the drift layer. In a turn-off operation, however, excessive carriers in the drift layer must be entirely discharged externally from the IGBT or must be removed by recoupling between the electrons and holes. Therefore, when many excessive carriers are present, a current will flow until the carriers are discharged so that the turn-off loss increases.

Japanese Patent Laying-Open Nos. 2003-158269 and 2005-109394 have disclosed structures that reduce the turn-off loss of the IGBT and rapidly turn off it.

In Japanese Patent Laying-Open No. 2003-158269, an insulated gate control electrode is arranged on a surface of a drift layer of an IGBT. In a turn-off operation of the IGBT, a potential of this insulated gate control electrode is adjusted to absorb holes produced in the drift layer and thereby to suppress occurrence of a tail current in the turn-off operation.

In the insulated gate control electrode disclosed in Japanese Patent Laying-Open No. 2003-158269, the gate insulating film has a thickness, e.g., of 5 nm-30 nm and the holes are forcedly pulled out by making use of a tunneling phenomenon or an avalanche phenomenon.

In the structure disclosed in Japanese Patent Laying-Open No. 2005-109394, a P-channel MOS transistor (insulated gate field-effect transistor) is arranged between a collector electrode node and a base of a bipolar transistor. An N-channel MOS transistor for controlling a base current of the bipolar transistor is arranged in series with this P-channel MOS transistor.

The P-channel MOS transistor is kept off during the operation (on state) of the IGBT. In the turn-off operation, the P-channel MOS transistor is set to the on state so that a hole current flowing into the bipolar transistor from the collector electrode may bypass it. This prevents injection of the holes into the base layer from the collector electrode in the turn-off operation, and residual carriers (holes) are rapidly discharged from the drift layer (base layer) of the bipolar transistor so that the switching loss is reduced. Thereby, the low switching loss and the fast operation in the turn-off operation are achieved, and further the low on-state voltage of the IGBT can be maintained.

In the structure disclosed in Japanese Patent Laying-Open No. 2005-109394, the gate insulating film of the P-channel MOS transistor has a thickness that ensures a gate breakdown voltage equal to or larger than, e.g., an element breakdown voltage of the field insulating film or the like so that the breakdown voltage in the off state may be ensured.

In Japanese Patent Laying-Open No. 2003-158269, the insulated gate control electrode arranged at the surface of the drift layer (base layer) is used for discharging the holes in the turn-off operation, using the tunneling phenomenon or the avalanche phenomenon. In this case, a high voltage is applied to the insulating film of 5 nm to 30 nm in thickness located under the control electrode, and this results in a problem that the breakdown characteristics of this insulating film are liable to deteriorate.

In the structure disclosed in Japanese Patent Laying-Open No. 2003-158269, the insulated gate control electrode is arranged independently of the control electrode (the gate of the MOS transistor) controlling the turn-on and turn-off of the IGBT. This results in a problem that the timing of the turn-on/turn-off of the IGBT and the timing of the voltage application to the insulated gate control electrode cannot be adjusted without difficulty.

In the structure disclosed in Japanese Patent Laying-Open No. 2005-109394, the gate electrode of the P-channel MOS transistor is fixed to the ground level, or the gate voltages of both the P- and N-channel MOS transistors are controlled according to the output signal of the same control circuit.

While the IGBT is off, the P-channel MOS transistor is kept on. In this case, the gate electrode of the P-channel MOS transistor carries a voltage similar to that on the emitter electrode. Therefore, when the P-channel MOS transistor is on, it carries a high voltage similar to a collector-emitter voltage Vice. Therefore, the P-channel MOS transistor has the thick gate insulating film of a thickness larger than, e.g., that of the field insulating film for ensuring the breakdown voltage. Consequently, this P-channel MOS transistor has a larger height than N-channel MOS transistors around it, resulting in a problem that a large step or difference in level occurs in the IGBT. Since the P-channel MOS transistor receives the high voltage, a sufficient distance must be kept from the surrounding impurity regions for ensuring the insulation with respect to the impurity regions, which results in undesired increase of the footprint of the element.

SUMMARY OF THE INVENTION

An object of the invention is to provide a semiconductor device that can reduce a footprint of an element while maintaining a low on-resistance, a low switching loss and intended breakdown characteristics of an IGBT.

Another object of the invention is to provide a semiconductor device that can reduce an element footprint while maintaining intended characteristics.

A semiconductor device according to an aspect of the invention includes a semiconductor substrate, a first semiconductor region of a first conductivity type formed in the semiconductor substrate, and an MOS transistor of the first conductivity type formed at a surface of the semiconductor substrate. The MOS transistor of the first conductivity type includes a gate electrode, a source electrode, a drain electrode, a second semiconductor region of a second conductivity type, a third semiconductor region of the first conductivity type and a fourth semiconductor region of the first conductivity type. The second semiconductor region has a channel formed by a potential difference between the gate electrode and the source electrode, is formed in the first semiconductor region and is electrically connected to the drain electrode. The third semiconductor region is formed in the second semiconductor region, and is electrically connected to the source electrode. The fourth semiconductor region is formed in the second semiconductor region and is electrically connected to the drain electrode. The semiconductor device further includes a fifth semiconductor region of the second conductivity and an electrode. The fifth semiconductor region is formed in the first semiconductor region, is opposed to the second semiconductor region with the first semiconductor region therebetween and is electrically connected to the gate electrode. The electrode is formed on the first semiconductor region located between the second and fifth semiconductor regions with an insulating film therebetween, and is electrically connected to the gate electrode.

A semiconductor device according to another aspect of the invention includes a semiconductor substrate, a first semiconductor region of a first conductivity type formed in the semiconductor substrate, and an MOS transistor of the first conductivity type formed at a surface of the semiconductor substrate. The MOS transistor of the first conductivity type includes a gate electrode, a source electrode, a drain electrode, a second semiconductor region of a second conductivity type, a third semiconductor region of the first conductivity type and a fourth semiconductor region of the first conductivity type. The second semiconductor region has a channel formed by a potential difference between the gate electrode and the source electrode, is formed in the first semiconductor region and is electrically connected to the drain electrode. The third semiconductor region is formed in the second semiconductor region, and is electrically connected to the source electrode. The fourth semiconductor region is formed in the second semiconductor region and is electrically connected to the drain electrode. The semiconductor device further includes a fifth semiconductor region of the second conductivity. The fifth semiconductor region is formed in the first semiconductor region, is opposed to the second semiconductor region with the first semiconductor region therebetween and is electrically connected to the gate electrode. The first semiconductor region includes a heavily doped region formed at the semiconductor substrate surface located between the second and fifth semiconductor regions, and a lightly doped region containing impurities of the first conductivity type at a lower concentration than the heavily doped region.

A semiconductor device according to still another aspect of the invention includes a semiconductor substrate, a first semiconductor region of a first conductivity type formed in the semiconductor substrate, and an MOS transistor of the first conductivity type formed at a surface of the semiconductor substrate. The MOS transistor of the first conductivity type includes a gate electrode, a source electrode, a drain electrode, a second semiconductor region of a second conductivity type, a third semiconductor region of the first conductivity type and a fourth semiconductor region of the first conductivity type. The second semiconductor region has a channel formed by a potential difference between the gate electrode and the source electrode, is formed in the first semiconductor region and is electrically connected to the drain electrode. The third semiconductor region is formed in the second semiconductor region, and is electrically connected to the source electrode. The fourth semiconductor region is formed in the second semiconductor region and is electrically connected to the drain electrode. The semiconductor device further includes a fifth semiconductor region of the second conductivity. The fifth semiconductor region is formed in the first semiconductor region, is opposed to the second semiconductor region with the first semiconductor region therebetween and is electrically connected to the gate electrode. The first semiconductor region includes a heavily doped region formed at the semiconductor substrate surface located between the second and fifth semiconductor regions, and a lightly doped region containing impurities of the first conductivity type at a lower concentration than the heavily doped region. Each of the second and fifth semiconductor regions is formed by implanting the impurities, and a diffusion depth of the fifth semiconductor region is smaller than a diffusion depth of the second semiconductor region.

A semiconductor device according to yet another aspect of the invention includes a semiconductor substrate, a first semiconductor region of a first conductivity type formed in the semiconductor substrate, and an MOS transistor of the first conductivity type formed at a surface of the semiconductor substrate. The MOS transistor of the first conductivity type includes a gate electrode, a source electrode, a drain electrode, a second semiconductor region of a second conductivity type, a third semiconductor region of the first conductivity type and a fourth semiconductor region of the first conductivity type. The second semiconductor region has a channel formed by a potential difference between the gate electrode and the source electrode, is formed in the first semiconductor region and is electrically connected to the drain electrode. The third semiconductor region is formed in the second semiconductor region, and is electrically connected to the source electrode. The fourth semiconductor region is formed in the second semiconductor region and is electrically connected to the drain electrode. The semiconductor device further includes a fifth semiconductor region of the second conductivity and an insulating film. The fifth semiconductor region is formed in the semiconductor substrate and is electrically connected to the gate electrode. The insulating film is formed in the first semiconductor region, and isolates the second and fifth semiconductor regions from each other.

The semiconductor device according to the invention can reduce a footprint of an element while maintaining a low on-resistance, a low switching loss and intended breakdown characteristics of an IGBT. Also, the semiconductor device can reduce an element footprint while maintaining the intended characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
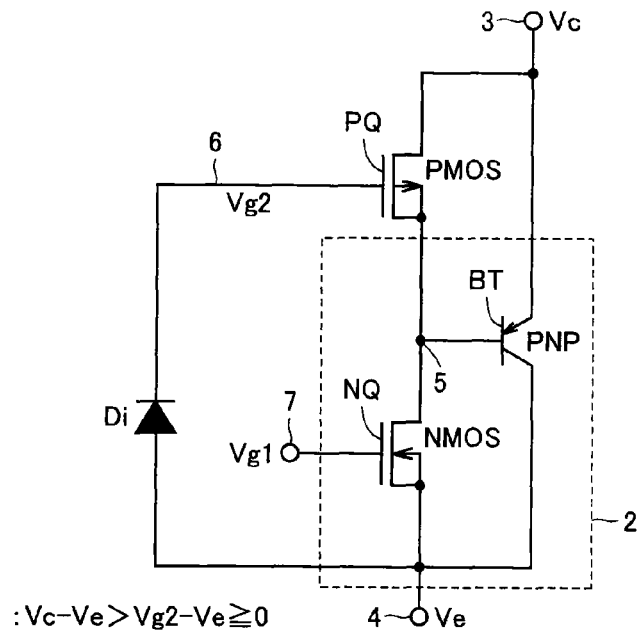
FIG. 1 shows an electrically equivalent circuit of a semiconductor device according to a first embodiment of the invention.

Embodiments of the invention will now be described with reference to the drawings. In the drawings, a region indicated by "P−" has a P-type conductivity, and has a P-type impurity concentration lower than that of a region indicated by "P". Likewise, a region indicated by "N−" has an N-type conductivity, and has an N-type impurity concentration lower than that of a region indicated by "N". Further, the region indicated by "P+" has a P-type conductivity, and has a P-type impurity concentration higher than that of a region indicated by "P".

(First Embodiment)

In FIG. 1, a semiconductor device includes a PNP bipolar transistor (bipolar transistor) BT, an N-channel MOS transistor (MOS transistor of a second conductivity type) NQ controlling a base current of bipolar transistor BT, a P-channel MOS transistor (MOS transistor of a first conductivity type) PQ interrupting carrier injection when bipolar transistor BT is turned off, and a PN junction diode Di.

Bipolar transistor BT has an emitter (first conduction node) connected to a collector electrode node 3 and a collector (second conduction node) connected to an emitter electrode node 4. MOS transistor NQ is connected between emitter electrode node 4 and a base electrode node 5 of bipolar transistor BT. More specifically, MOS transistor NQ has a source coupled to emitter electrode node 4, a drain connected to base electrode node 5 of bipolar transistor BT and a gate electrode node 7 receiving a control signal Vg1. MOS transistor NQ has a back gate (substrate) and a source coupled together. MOS transistor NQ selectively becomes electrically conductive between emitter electrode node 4 and base electrode node 5 of the bipolar transistor according to control signal Vg1. When it becomes conductive, MOS transistor NQ electrically connects emitter electrode node 4 and base electrode node 5 of the bipolar transistor together.

MOS transistor PQ has a source connected to collector electrode node 3, and has a substrate and a drain that are connected to base electrode node 5 of bipolar transistor BT. A circuit unit 2 formed of bipolar transistor BT and MOS transistor NQ corresponds to an electrically equivalent circuit of an ordinary IGBT. In the following description, the "IGBT" refers to a unit represented by this block 2.

The semiconductor device shown in FIG. 1 further includes PN junction diode Di connected between a gate electrode node 6 of MOS transistor PQ and emitter electrode node 4. This diode Di has a cathode electrically connected to gate electrode node 6 of MOS transistor PQ and an anode electrically connected to emitter electrode node 4. Diode Di relieves the voltage applied to the gate insulating film of MOS transistor PQ when MOS transistor PQ is off.

Figure 2:
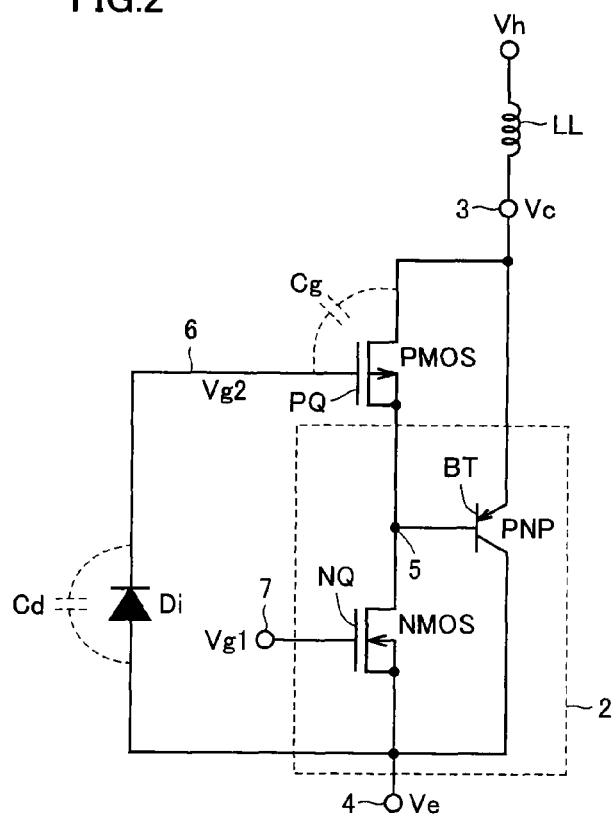
FIG. 2 schematically shows parasitic components of the semiconductor device according to the first embodiment of the invention.

In the state discussed below, an inductive load LL is connected to collector electrode node 3 of the semiconductor device as shown in FIG. 2. Inductive load LL is connected between a power supply node supplying a high-side voltage Vh and collector electrode node 3. A gate capacitance Cg is present between gate electrode node 6 of MOS transistor PQ and collector electrode node 3. Also, a junction capacitance Cd provided by a PN junction is present in diode Di.

In the structure shown in FIG. 2, when IGBT 2 is turned on, a component (L·(di/dt)) of inductive load LL acts to apply a majority of high-side voltage Vh to inductive load LL, and a collector potential Vc of collector electrode node 3 rapidly lowers. When IGBT 2 is turned off, collector potential Vc of collector electrode node 3 attains substantially the same level as high-side voltage Vh. It is now assumed that MOS transistor PQ has a threshold voltage of an absolute value Vthp (which will be simply referred to as a "threshold voltage Vthp" hereinafter). Also, an emitter potential Ve of emitter electrode node 4 is set to a lowest level among those of voltages that are usually applied to the semiconductor device.

In the following description, a "conductive state" and a "nonconductive state" represent the same means as the "on state" and the "off state", respectively. Particularly, the "conductive state" and the "nonconductive state" are used for enhancing the presence and absence of the current, respectively.

In a turn-on operation of IGBT 2, a voltage of control signal Vg1 applied to gate electrode node 7 of MOS transistor NQ attains the H-level to turn on MOS transistor NQ. Thereby, bipolar transistor BT is supplied with a base current and attains the conductive state so that IGBT 2 is turned on. When IGBT 2 is turned on, a potential Vg2 of gate electrode node 6 of MOS transistor PQ lowers with lowering of collector potential Vc of collector electrode node 3, and particularly lowers according to capacitance values of capacitances Cg and Cd. When gate potential Vg2 of gate electrode node 6 attains a level of emitter potential Ve of emitter electrode node 4, a forward bias operation of diode Di suppresses potential lowering of gate potential Vg2 of gate electrode node 6, and diode Di clamps the lowest potential of gate potential Vg2.

In the turn-on operation of IGBT 2, when a difference (Vc−Vg2) between collector potential Vc of collector electrode node 3 and gate potential Vg2 of gate electrode node 6 becomes equal to or lower than threshold voltage Vthp of MOS transistor PQ (i.e., Vc−Vg2<Vthp), MOS transistor PQ is turned off. In the turn-on operation, therefore, an operation of restricting the hole injection into PNP bipolar transistor BT is not performed.

In the turn-off operation of IGBT 2, the voltage of control signal Vg1 applied to gate electrode node 7 of MOS transistor NQ is set to, e.g., 0 V, and MOS transistor NQ is turned off. Thereby, the supply of the base current to bipolar transistor BT stops, and bipolar transistor BT changes to the off state. Collector potential Vc of collector electrode node 3 rises in response to this change of bipolar transistor BT to the off state. Parasitic capacitances Cg and Cd raise gate potential Vg2 in response to the rising of collector potential Vc.

In the turn-off operation of IGBT 2, when a difference (Vc−Vg2) between collector potential Vc and gate potential Vg2 exceeds the threshold voltage of MOS transistor PQ, MOS transistor PQ is turned on to short-circuit the emitter region and base region (base electrode node 5) of bipolar transistor BT. Thereby, MOS transistor PQ discharges the current flowing from collector electrode node 3, and the supply of holes to bipolar transistor BT is interrupted.

In the turn-off operation, since the supply of holes to the emitter region of bipolar transistor BT is interrupted, collector potential Vc of collector electrode node 3 rapidly rises when the discharging of carriers from the base region of bipolar transistor BT is completed. Thereby, the period for which a tail current flows can be short, and a switching loss at the time of the turn-off can be reduced so that the fast operation can be implemented. In the on state (conductive state) of IGBT 2, collector-emitter voltage Vice of bipolar transistor BT is sufficiently low, and the on-state voltage can be low.

During a transition state, e.g., for turn-off, gate potential Vg2 attains the voltage level that is determined by junction capacitance Cd of diode Di and gate capacitance Cg of MOS transistor PQ. Gate potential Vg2 is at the same voltage level as that between emitter potential Ve and collector potential Vc.

When the turn-off state is attained and IGBT 2 is off (nonconductive), diode Di is in a reverse bias state. In this case, a leak current of diode Di and the like cause gate potential Vg2 to attain finally the same level as emitter potential Ve. In the actual device structure, however, the current flowing between gate electrode node 6 and collector electrode node 3 as well as a balance between voltages that are placed on gate capacitance Cg and junction capacitance Cd, respectively, and another factor substantially keep gate potential Vg2 in a stable voltage (e.g., a punch through voltage) balanced between emitter potential Ve and collector potential Vc, as will be described below.

Therefore, gate potential Vg2 of gate electrode node 6 of MOS transistor PQ can be set to a voltage level higher than emitter potential Ve, and the voltage applied to the gate insulating film of MOS transistor PQ can be reduced so that the gate insulating film can be reduced in thickness. In the nonconductive state, the voltage applied to the gate insulating film is low. Therefore, it is not necessary to keep a large distance to a peripheral region (the electrode layer and the like) for ensuring a breakdown voltage with respect to the peripheral region so that the footprint of the element (cell) can be small.

Figure 3:
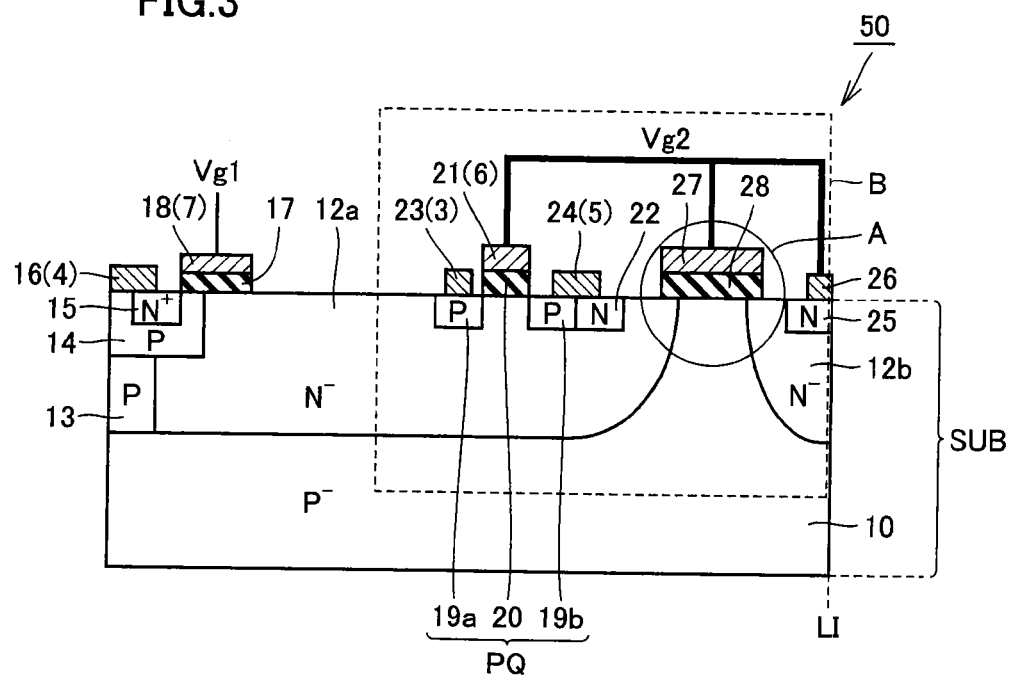
FIG. 3 schematically shows a sectional structure of the semiconductor device according to the first embodiment of the invention.

Referring to FIG. 3, a P-type semiconductor substrate (first semiconductor region) 10 is formed in a semiconductor substrate SUB, and P-channel MOS transistor PQ is formed at a surface of semiconductor substrate SUB. N-type impurity regions (second and fifth semiconductor regions) 12a and 12b are formed in P-type semiconductor region 10 at the surface of semiconductor substrate SUB. N-type impurity region 12a at the surface of semiconductor substrate SUB neighbors to N-type impurity region 12b with P-type semiconductor region 10 therebetween.

A P-type impurity region 13 surrounds a part (middle and left portion in FIG. 3) of N-type impurity region 12a. In a plan layout (not shown) of this semiconductor device, the various regions are formed concentrically around an end L1 on the right side of FIG. 3. Therefore, P-type impurity region 13 surrounds N-type impurity region 12a in the structure described below. P-type impurity region 13 has a function of discharging the holes to the emitter electrode node at the time of turn-off of the IGBT.

A P-type impurity region 14 is formed on P-type impurity region 13 and at a part of surface of N-type impurity region 12a, and is internally provided with a heavily doped N-type impurity region 15. P-type impurity region 14 surrounds N-type impurity region 15. An emitter electrode 16 connected to emitter electrode node 4 is formed in contact with both P-type impurity region 14 and N-type impurity region 15. Emitter electrode 16 connects the back gate and source of MOS transistor NQ shown in FIG. 1 together, and electrically connects them to emitter electrode node 4.

An gate electrode 18 electrically connected to gate electrode node 7 is formed on the surface of P-type impurity region 14 with a gate insulating film 17 therebetween. Gate insulating film 17 and gate electrode 18 extend to a position above N-type impurity region 12a, and form a channel at the surface of P-type impurity region 14 between N-type impurity regions 15 and 12a.

P-type impurity regions (third and fourth semiconductor regions) 19a and 19b are formed within N-type impurity region 12a at the surface of semiconductor substrate SUB. P-type impurity regions 19a and 19b are spaced from P-type impurity region 14, and are formed at the surface of semiconductor substrate SUB with N-type impurity region 12a interposed between them. A gate electrode 21 is formed above N-type impurity region 12a located between P-type impurity regions 19a and 19b with a gate insulation film 20 therebetween. Gate electrode 21 is electrically connected to gate electrode node 6 in FIG. 1. A collector electrode 23 (a source electrode of an MOS transistor of a first conductivity type) is formed at the surface of P-type impurity region 19a and is connected to collector electrode node 3 shown in FIG. 1. P-type impurity region 19a is also connected electrically to collector electrode 23. An N-type impurity region 22 (second semiconductor region) neighbors to P-type impurity region 19b, and a drain electrode 24 forming base electrode node 5 shown in FIG. 1 is formed on both the surfaces of P- and N-type impurity regions 19b and 22. Drain electrode 24 is electrically connected to P- and N-type impurity regions 19b and 22.

A heavily doped N-type impurity region (fifth impurity region) 25 is formed at the surface of semiconductor substrate SUB in N-type impurity region 12b. An electrode 26 electrically connected to gate electrode 21 is formed on the surface of N-type impurity region 25. Thereby, N-type impurity regions 12b and 25 are electrically connected to gate electrode 21. Electrode 26 corresponds to a cathode of diode Di shown in FIG. 1, and P-type semiconductor region 10 corresponds to an anode thereof. When diode Di is in the nonconductive state, punch through occurs in P-type semiconductor region 10 between N-type impurity regions 12a and 12b (i.e., punch through breakdown occurs in the PN junction), and a punch through voltage restricts the voltage applied to gate electrode 21.

Thus, when the voltage between N-type impurity region 12a and P-type semiconductor region 10 reaches the punch through voltage, a depletion layer extends from a boundary between N- and P-type impurity regions 12a and 10 toward N-type impurity region 12b, and comes into contact with the depletion layer between N- and P-type impurity regions 12b and 10 so that a punch through breakdown occurs. This punch through breakdown establishes an electric connection at the surface of P-type semiconductor region 10 between N-type impurity regions 12a and 12b via the depletion layer, and the voltage is transmitted from N-type impurity region 22 to gate electrode 21 via N-type impurity region 25 and electrode 26 so that the lowering of gate potential Vg2 is suppressed. When gate potential Vg2 rises, the channel resistance of MOS transistor PQ increases, and the voltage level of N-type impurity region 22 lowers so that the punch through breakdown no longer occurs in the PN junction on the surface of P-type semiconductor region 10, and gate potential Vg2 no longer rises. Thereby, the voltage level of gate electrode 21 keeps the voltage level that is dependent on the punch through voltage and is higher than emitter potential Ve of emitter electrode 16.

An electrode 27 (field plate) is formed on semiconductor substrate SUB immediately above P-type semiconductor region 10 located between N-type impurity regions 12a and 12b with an insulating film 28 therebetween. Electrode 27 is electrically connected to gate electrode 21. The opposite ends of each of electrode 27 and insulating film 28 are extended to positions immediately above N-type impurity regions 12a and 12b, respectively.

In the structure shown in FIG. 3, N-channel MOS transistor NQ is basically formed of P-type impurity region 14, N-type impurity region 15, gate insulating film 17, gate electrode 18 and N-type impurity region 12a. The back gate of N-channel MOS transistor NQ is formed of P-type impurity region 14, and the back gate and the source (N-type impurity region 15) thereof are electrically connected together by emitter electrode 16.

P-channel MOS transistor PQ is basically formed of P-type impurity regions 19a and 19b, N-type impurity region 12a, a gate insulating film 20 and gate electrode 21. N-type impurity region 12a forming the back gate of P-channel MOS transistor PQ is coupled to drain electrode 24 via N-type impurity region 22. This implements a structure in which the back gate and the drain of MOS transistor PQ are connected to drain electrode 24 electrically connected to base electrode node 5.

Diode Di is basically formed of N-type impurity region 25, N-type impurity region 12b, P-type semiconductor region 10 and P-type impurity regions 13 and 14. The capacitance of the PN junction between N-type impurity region 12b and P-type semiconductor region 10 is used for lowering potential Vg2 of gate electrode node 6 by the capacitance division at the time of turn-off of the IGBT.

Bipolar transistor BT is basically formed of P-type impurity region 19a, N-type impurity region 12a and P-type impurity regions 13 and 14. N-type impurity region 12a functions as the base region of the bipolar transistor.

In the structure shown in FIG. 3 and particularly at the time of the turn-on of the IGBT, control signal Vg1 applied to gate electrode 18 attains a positive voltage level, and a channel is formed at the surface of P-type impurity region 14 between N-type impurity regions 15 and 12a so that electrons flow from emitter electrode 16 to N-type impurity region 12a. At this time, the holes flow from collector electrode 23 through P-type impurity region 19a into N-type impurity region 12a. Thereby, conductivity modulation occurs in N-type impurity region 12a, and the resistance value thereof lowers so that a larger current flows through N-type impurity region 12a. Thereby, the base current of bipolar transistor BT increases, and bipolar transistor BT is turned on. Even when the potential of collector electrode 23 lowers at the time of turn-on, the potential difference between P-type impurity region 19a and gate electrode 21 is equal to or lower than threshold voltage Vthp of the P-channel MOS transistor, and the P-channel MOS transistor is kept off. Therefore, no adverse effect is exerted on the supply of holes from collector electrode 23 to N-type impurity region 12a.

At the time of this turn-on, P-type impurity regions 19a and 19b as well as N-type impurity region 22 keep the potential level equal to that of N-type impurity region 12a, and thus nearly equal to emitter potential Ve. P-type semiconductor region 10 is at the level of emitter potential Ve. The PN junction between N-type impurity region 12b and P-type semiconductor region 10 is in the reverse bias state, and diode Di is kept off.

At the time of turn-off of the IGBT, control signal Vg1 placed on gate electrode 18 is set, e.g., to 0 V, and the channel (inversion layer) at the surface of P-type impurity region 14 disappears. Thereby, the current path to N-type impurity region 12a is interrupted, and bipolar transistor BT changes to the turned-off state. When potential Vc of collector electrode 23 rises, the potential difference between P-type impurity region 19a and gate electrode 21 exceeds threshold voltage Vthp of MOS transistor PQ, and MOS transistor PQ is turned on. A channel is formed at the surface of N-type impurity region 12a between P-type impurity regions 19a and 19b so that P-type impurity region 19b absorbs the holes supplied from collector electrode 23 and the carriers (holes) remaining in N-type impurity region 12a, and the supply of the holes to N-type impurity region 12a is interrupted.

When the discharge of the residual carriers (holes) from N-type impurity region 12a is completed, the bipolar transistor is turned off, and the IGBT is turned off. In this off state, the PN junction between N-type impurity region 12a and P-type semiconductor region 10 is in a reverse bias state, and the depletion layer expands from P-type semiconductor region 10 to N-type impurity region 12a, and finally reaches the surface of N-type impurity region 12a. This relieves the electric field concentration at the surface of N-type impurity region 12a, and implements the high-breakdown-voltage structure.

At the time of turn-off of the IGBT, the level of gate potential Vg2 of gate electrode 21 is raised by the capacitive coupling via the gate capacitance according to the rising of collector potential Vc. In this operation, the capacitive coupling by the capacitance of the PN junction between N-type impurity region 12b and P-type semiconductor region 10 suppresses the rising of gate potential Vg2. When the voltage difference (Vc−Vg2) becomes equal to or lower than threshold voltage Vthp, a channel is formed under gate electrode 21, and P-type impurity regions 19a and 19b and N-type impurity region 12a connected via this channel attain the same potential so that the supply of the holes to N-type impurity region 12a from collector electrode 23 is interrupted.

P-type impurity region 19b, drain electrode 24 and N-type impurity region 22 transmit collector potential Vc to N-type impurity region 12a. Thereby, the PN junction between N-type impurity region 12a and P-type semiconductor region 10 enters a reverse bias state, and the punch through breakdown occurs in the PN junction between N-type impurity regions 12a and 12b so that the punch through state occurs between N-type impurity regions 12a and 12b. This punch through voltage suppresses the lowering of the potential level of gate potential Vg2, and gate potential Vg2 is kept at this voltage level.

Gate potential Vg2 of gate electrode 21 is at the level intermediate between emitter potential Ve and collector potential Vc. Therefore, the voltage applied to gate insulating film 20, i.e., the difference between potential Vc of collector electrode 23 and potential Vg2 of gate electrode 21 is smaller than the collector-emitter voltage. Therefore, the film thickness of gate insulating film 20 can be small. Since it is possible to relieve the voltage applied to gate insulating film 20, it is not necessary to employ a structure for ensuring the breakdown voltage, e.g., by keeping a large distance between collector and gate electrodes 23 and 21, or by keeping a large distance between gate and drain electrodes 21 and 24 as well as a large distance between gate and collector electrodes 21 and 23. Therefore, the whole footprint of the semiconductor device can be small.

When the punch through occurs between N-type impurity regions 12a and 12b according to the collector voltage applied from collector electrode 23, the punch through voltage caused thereby suppresses the lowering of gate potential Vg2. Therefore, the distance between N-type impurity regions 12a and 12b is set to an extent causing the punch through.

According to the first embodiment of the invention, as described above, the diode element is connected as the voltage relieving element between the gate and emitter electrode nodes of the P-channel MOS transistor employed for reducing the turn-off loss. This structure can relieve the voltage that is applied to the gate insulating film at the time of turn-off of the P-channel MOS transistor, without adversely affecting the on and off operations of the P-channel MOS transistor. Thereby, the semiconductor device can achieve a small footprint, a high-breakdown voltage structure and a low loss.

Further, the first embodiment can reduce the element footprint while maintaining the punch through characteristics. This will be described later.

Figure 4:
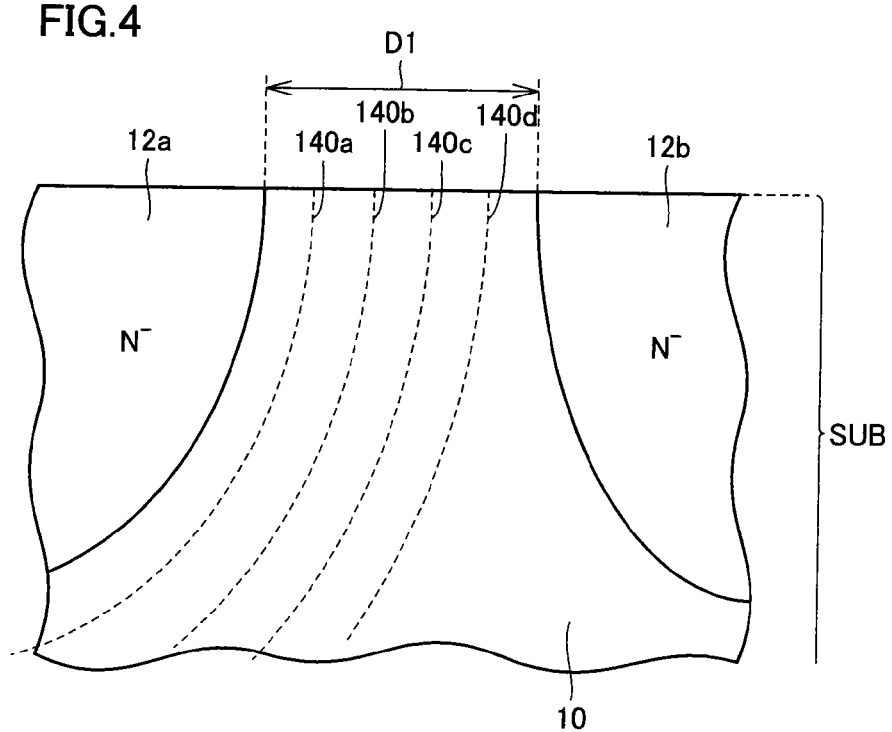
FIG. 4 schematically shows a state of extension of a depletion layer in the case where an electrode 27 is not formed in the structure shown in FIG. 3, and particularly shows, on an enlarged scale, a portion indicated by B in FIG. 3.

Referring to FIG. 4, as described above, when the IGBT is turned off, the PN junction between N-type impurity region 12a and P-type semiconductor region 10 enters the reverse bias state. Thereby, the depletion layer is formed in the boundary between N-type impurity region 12a and P-type semiconductor region 10. The depletion layer extends in the order of depletion layers 140a, 140b, 140c and 140d as the reverse bias between N-type impurity region 12a and P-type semiconductor region 10 increases. Finally, P-type semiconductor region 10 between N-type impurity regions 12a and 12b is entirely depleted to cause punch through breakdown between N-type impurity regions 12a and 12b. Accordingly, the punch through voltage between N-type impurity regions 12a and 12b depends on the distance between N-type impurity regions 12a and 12b, and this punch through voltage restricts the maximum value of gate potential Vg2 of MOS transistor PQ in the off state. For effectively restricting the maximum value of gate potential Vg2 of MOS transistor PQ, therefore, it is necessary to increase a distance D1 between N-type impurity regions 12a and 12b, i.e., distance D1 between the N-type semiconductor regions electrically connected to drain and gate electrodes 24 and 21, respectively. However, large distance D1 increases the footprint per semiconductor device, and thus degrades the effective on-resistance ((on-resistance)×(footprint)) of the semiconductor device.

Figure 5:
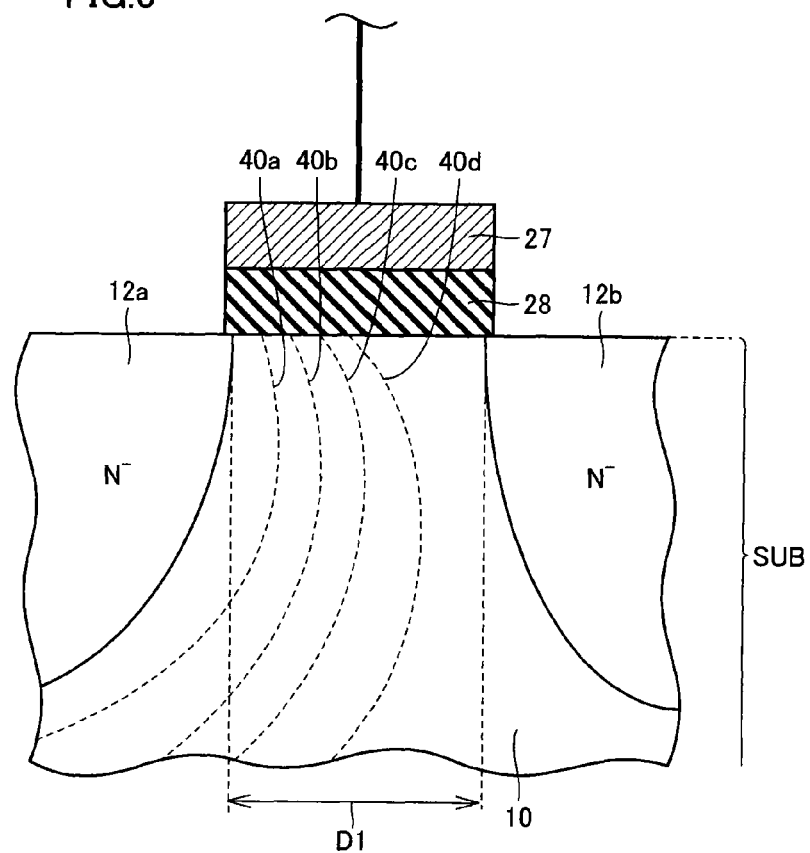
FIG. 5 schematically shows the state of extension of the depletion layer in the structure shown in FIG. 3, and particularly shows, on an enlarged scale, the portion indicated by B in FIG. 3.

Referring to FIG. 5, in this embodiment, the electric field applied by electrode 27 to the surface of semiconductor substrate SUB suppresses, at the surface of semiconductor substrate SUB, the extension of the depletion layer at the boundary between N-type impurity region 12a and P-type semiconductor region 10. Thus, the potential of electrode 27 is substantially equal to gate potential Vg2, and is at the voltage level between emitter potential Ve and collector potential Vc. When electrode 27 having such a potential applies the electric field to the surface of semiconductor substrate SUB, the depletion layer at the boundary between N-type impurity region 12a and P-type semiconductor region 10 extends in the order of depletion layers 40a, 40b, 40c and 40d, as the reverse bias between N-type impurity region 12a and P-type semiconductor region 10 increases. The extension of depletion layers 40a-40d are suppressed at the surface of semiconductor substrate SUB. Consequently, distance D1 can be reduced while maintaining the punch through voltage between N-type impurity regions 12a and 12b, and the element footprint can be reduced while maintaining the characteristics. The effective on-resistance of the semiconductor device can be improved.

The semiconductor device of the invention is not restricted to have the structure shown in FIG. 3, and is merely required to include at least the structure shown in a portion B of FIG. 3. The semiconductor device shown in the portion B of FIG. 3 includes semiconductor substrate SUB, P-type semiconductor region 10 formed in semiconductor substrate SUB and MOS transistor PQ formed at the surface of semiconductor substrate SUB. MOS transistor PQ includes gate electrode 21, collector electrode 23, drain electrode 24, N-type impurity region 12a and P-type impurity regions 19a and 19b. N-type impurity region 12a is provided with a channel formed by the potential difference between gate and collector electrodes 21 and 23, is formed in P-type semiconductor region 10 and is electrically connected to drain electrode 24. P-type impurity region 19a is formed in N-type impurity region 12a, and is electrically connected to collector electrode 23. P-type impurity region 19b is formed in N-type impurity region 12a, and is electrically connected to drain electrode 24. The semiconductor device further includes N-type impurity region 12b and electrode 27. N-type impurity region 12b is formed in P-type semiconductor region 10, is opposed to N-type impurity region 12a with P-type semiconductor region 10 therebetween and is electrically connected to gate electrode 21. Electrode 27 is formed on P-type semiconductor region 10 located between N-type impurity regions 12a and 12b with insulating film 28 therebetween, and is electrically connected to gate electrode 21.

Preferably, the semiconductor device according to the invention further includes structures represented in portions other that the portion B of FIG. 3, in addition to the structure represented in the portion B of FIG. 3. In this case, the semiconductor device further includes bipolar transistor BT, MOS transistor NQ and diode Di. Bipolar transistor BT includes an emitter electrically connected to collector electrode node 3 of MOS transistor PQ, a collector connected to emitter electrode node 4 and base electrode node 5 electrically connected to drain electrode 24 of MOS transistor PQ. MOS transistor NQ is connected between emitter electrode node 4 and base electrode node 5, and is selectively turned on according to control signal Vg1 to connect electrically emitter electrode node 4 to base electrode node 5. Diode Di has a cathode electrically connected to gate electrode 21 of MOS transistor PQ and an anode electrically connected to emitter electrode node 4.

(Second Embodiment)

Figure 6:
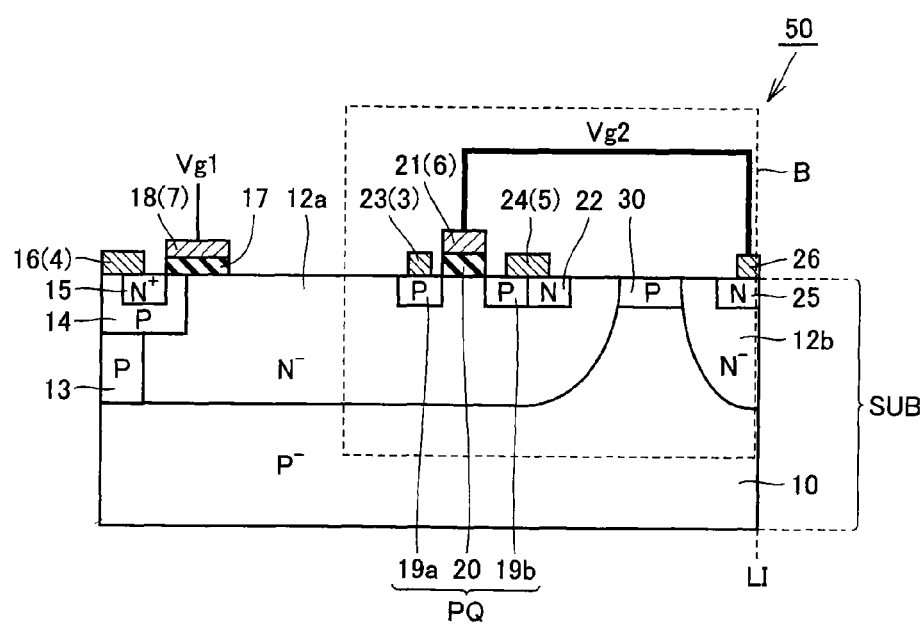
FIGS. 6 to 12 schematically shows sectional structures of semiconductor devices according to second to eighth embodiments of the invention, respectively.

Referring to FIG. 6, the semiconductor device of this embodiment differs from the semiconductor device of the first embodiment shown in FIG. 3 in that a P-type impurity region 30 is formed in place of electrode 27 and insulating film 28 (FIG. 3). P-type impurity region 30 is formed in P-type semiconductor region 10 at the surface of semiconductor substrate SUB located between N-type impurity regions 12a and 12b. P-type impurity region 30 may be in contact with N-type impurity regions 12a and 12b, and may be isolated from N-type impurity regions 12a and 12b.

The structures of the semiconductor device of this embodiment other than the above are substantially the same as those of the semiconductor device of the first embodiment. Therefore, the same members bear the same reference numbers, and description thereof is not repeated.

In the semiconductor device of this embodiment, P-type impurity region 30 having a higher impurity concentration than P-type semiconductor region 10 is formed at the surface of semiconductor substrate SUB located between N-type impurity regions 12a and 12b. Therefore, the extension of the depletion layer at the boundary between N- and P-type impurity regions 12a and 30 is locally suppressed at the surface of semiconductor substrate SUB. Consequently, this embodiment can reduce distance D1 while maintaining the punch through voltage between N-type impurity regions 12a and 12b, and can reduce the element footprint while maintaining the characteristics. Consequently, this embodiment can achieve substantially the same effect as the first embodiment.

(Third Embodiment)

Figure 7:
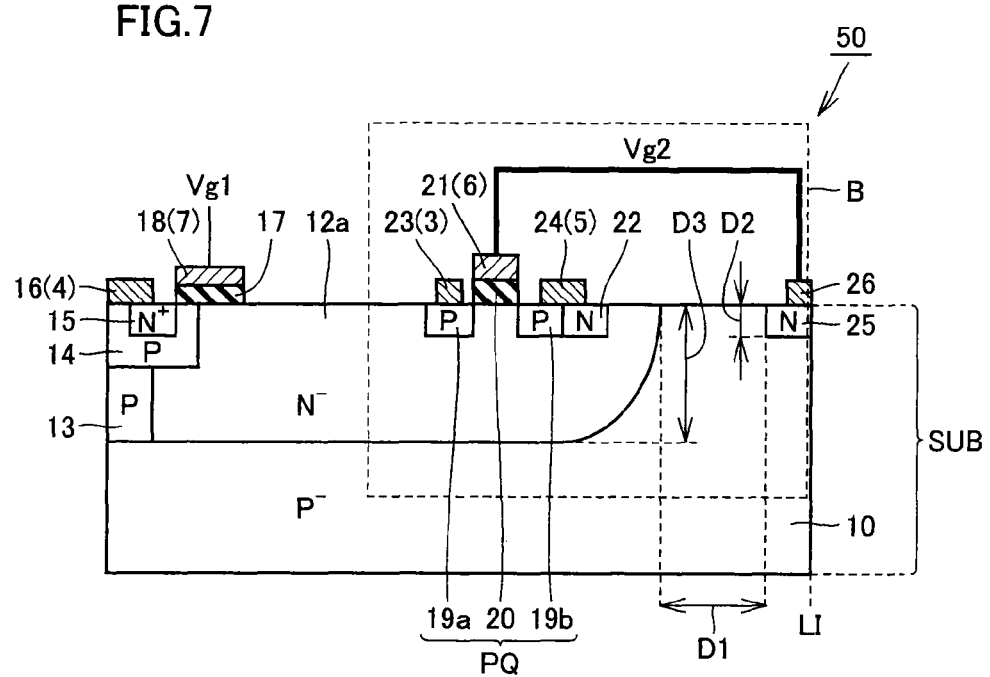

Referring to FIG. 7, the semiconductor device of this embodiment differs from the semiconductor device of the first embodiment shown in FIG. 3 in that electrode 27, insulating film 28 and N-type impurity region 12b (FIG. 3) are not formed. N-type impurity region 25 is opposed to N-type impurity region 12a with P-type semiconductor region 10 therebetween. Consequently, N-type impurity region 25 operates to lower a contact resistance of electrode 26, and also forms a PN junction of diode Di (FIG. 1) between N- and P-type impurity regions 25 and 10. The punch through voltage depends on distance D1 between N-type impurity regions 12a and 25, i.e., distance D1 between the N-type semiconductor region electrically connected to drain electrode 24 and the N-type semiconductor region electrically connected to gate electrode 21. Both N-type impurity regions 12a and 25 are formed by doping with impurities. A diffusion depth D2 of N-type impurity region 25 (i.e., diffusion depth D2 of the N-type semiconductor region electrically connected to gate electrode 21) is smaller than a diffusion depth D3 of N-type impurity region 12a, i.e., diffusion depth D3 of the N-type semiconductor region electrically connected to drain electrode 24.

The structures of the semiconductor device of this embodiment other than the above are substantially the same as those of the semiconductor device of the first embodiment. Therefore, the same members bear the same reference numbers, and description thereof is not repeated.

For example, when the semiconductor device includes N-type impurity region 12b as is done in the structure shown in FIG. 3, N-type impurity regions 12a and 12b are usually formed by implanting the N-type impurities, using one mask, for accurately controlling distance D1 (FIG. 4) between N-type impurity regions 12a and 12b. Consequently, N-type impurity regions 12a and 12b in FIG. 3 have the same diffusion depth. Conversely, in the embodiment shown in FIG. 7, diffusion depth D2 is equal to the diffusion depth of N-type impurity region 25 so that diffusion depth D2 is smaller than diffusion depth D3 of N-type impurity region 12a. This structure having the small diffusion depth suppresses the diffusion of the impurity region in the lateral direction in FIG. 3. Therefore, the footprint of the semiconductor device can be reduced corresponding to the elimination of N-type impurity region 12b. Consequently, the effect similar to that of the first embodiment can be achieved. Further, in a practical structure, already-existing N-type impurity region 25 is used as the PN junction of diode Di (FIG. 1), which results in a merit that the number of manufacturing steps does not increase.

In the embodiment already discussed, N-type impurity region 25 has a higher impurity concentration than N-type impurity region 12a. However, the impurity concentration of N-type impurity region 25 is nor particularly restricted, and may be substantially equal to the impurity concentration, e.g., of N-type impurity region 12a.

(Fourth Embodiment)

Figure 8:
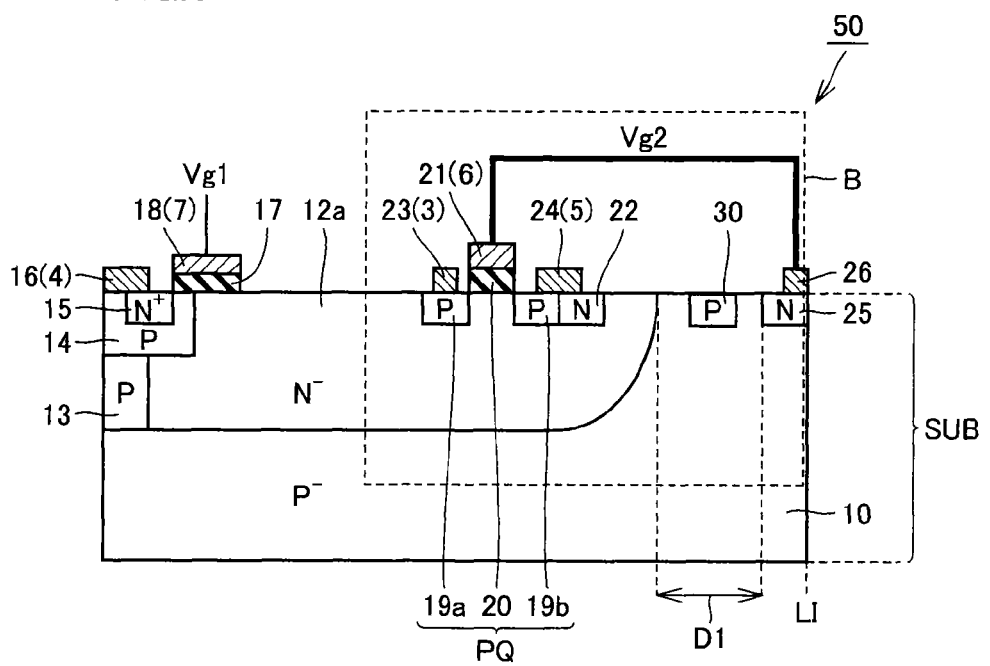

Referring to FIG. 8, the semiconductor device of this embodiment differs from the semiconductor device of the third embodiment shown in FIG. 7 in that P-type impurity region 30 is formed. P-type impurity region 30 is formed in P-type semiconductor region 10 at the surface of semiconductor substrate SUB. P-type impurity region 30 may be in contact with N-type impurity regions 12a and 25, or may be isolated from N-type impurity regions 12a and 25 by P-type semiconductor region 10.

The structures of the semiconductor device of this embodiment other than the above are substantially the same as those of the semiconductor device of the third embodiment. Therefore, the same members bear the same reference numbers, and description thereof is not repeated.

The semiconductor device according to the embodiment can achieve substantially the same effect as the third embodiment, and additionally can locally suppress, at the surface of semiconductor substrate SUB, the extension of the depletion layer located at the boundary between N-type impurity region 12a and P-type impurity region 30 because P-type impurity region 30 having a higher impurity concentration than P-type semiconductor region 10 is formed at the surface of semiconductor substrate SUB. Consequently, this embodiment can further decrease distance D1 while maintaining the punch through voltage between N-type impurity regions 12a and 25, and can further reduce the element footprint while maintaining the characteristics.

(Fifth Embodiment)

Figure 9:
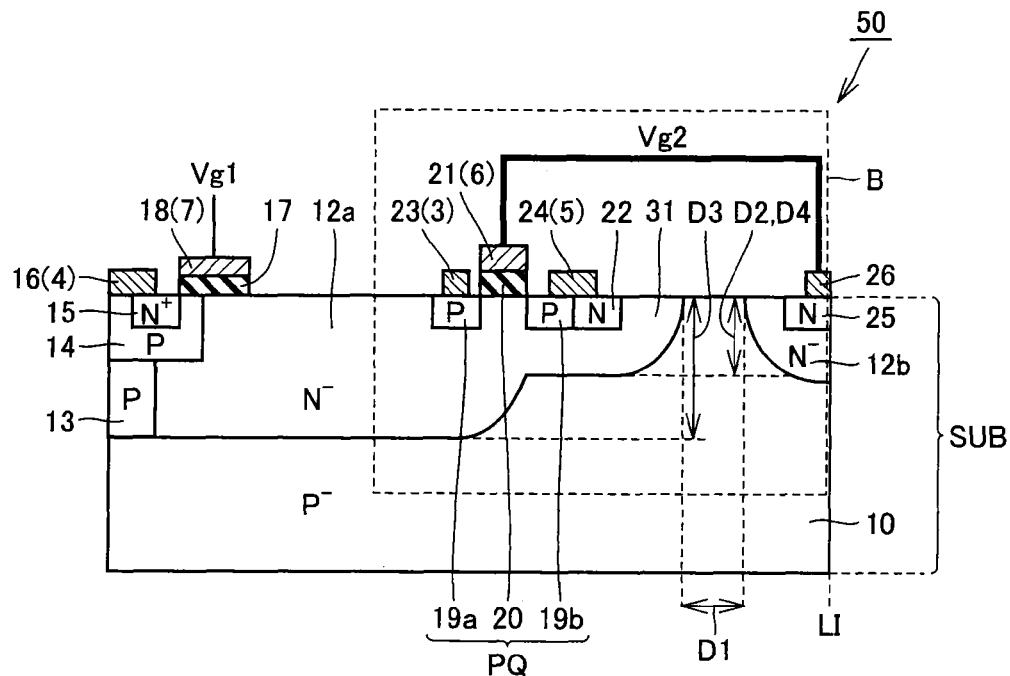

Referring to FIG. 9, the semiconductor device of this embodiment differs from the semiconductor device of the third embodiment shown in FIG. 7 in that N-type impurity regions 12b and 31 are formed. N-type impurity region 31 is in contact with N-type impurity region 12a, and is opposed to N-type impurity region 12b with P-type semiconductor region 10 therebetween. N-type impurity region 12b is formed in P-type semiconductor region 10 to surround N-type impurity region 25, and forms the PN junction of diode Di (FIG. 1) with respect to P-type semiconductor region 10. Both N-type impurity regions 12b and 31 are formed by implantation of impurities. Diffusion depths D4 and D2 of respective N-type impurity regions 31 and 12b are smaller than diffusion depth D3 of N-type impurity region 12a. Particularly, N-type impurity regions 12b and 31 may be formed in the same step. In this case, diffusion depths D2 and D4 are equal to each other as shown in FIG. 9, and distance D1 can be accurately defined by a mask that is used for forming N-type impurity regions 12b and 31.

The structures of the semiconductor device of this embodiment other than the above are substantially the same as those of the semiconductor device of the third embodiment. Therefore, the same members bear the same reference numbers, and description thereof is not repeated.

The semiconductor device of this embodiment can achieve substantially the same effect as the third embodiment. Further, this embodiment can suppress diffusion of the N-type semiconductor regions (N-type impurity regions 12a, 22 and 31) electrically connected to drain electrode 24 toward N-type impurity region 12b because diffusion depth D4 of N-type impurity region 31 is smaller than diffusion depth D3 of N-type impurity region 12a. Therefore, this embodiment can reduce the footprint of the N-type semiconductor region electrically connected to drain electrode 24, and can further reduce the footprint of the semiconductor device.

(Sixth Embodiment)

Figure 10:
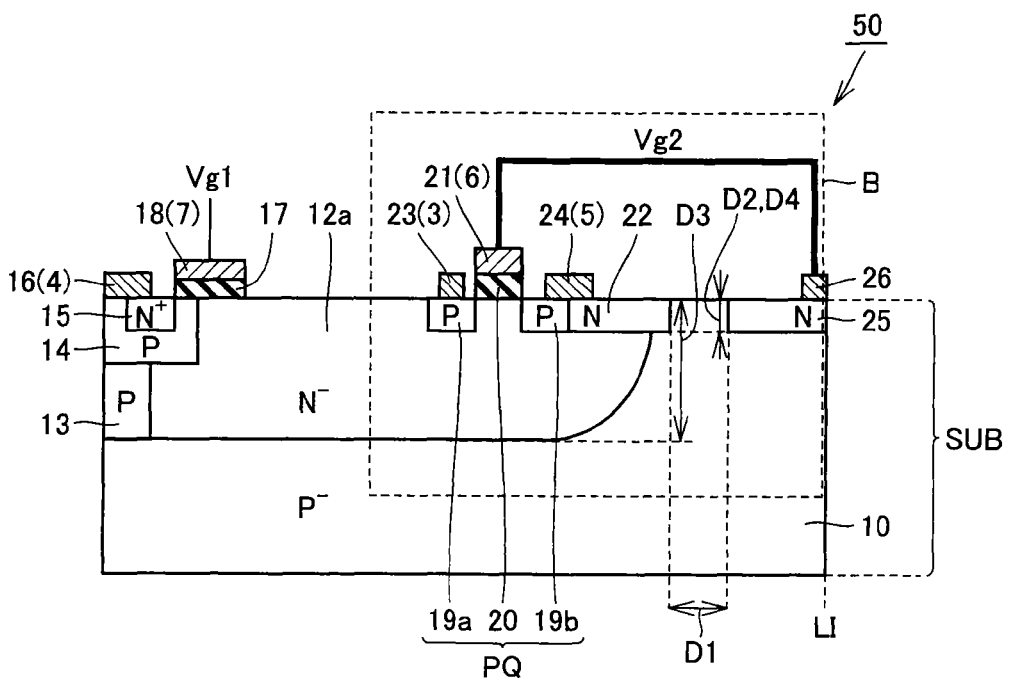

Referring to FIG. 10, the semiconductor device of this embodiment differs from the semiconductor device of the third embodiment shown in FIG. 7 in that N-type impurity region 22 (shallow region) protrudes into P-type semiconductor region 10. N-type impurity region 22 is in contact with N-type impurity region 12a (deep region), and is opposed to N-type impurity region 25 with P-type semiconductor region 10 therebetween. Both impurity concentrations of N-type impurity regions 22 and 25 are higher than that of N-type impurity region 12a. Both N-type impurity regions 22 and 25 are formed by implanting the impurities. Diffusion depths D4 and D2 of respective N-type impurity regions 22 and 25 are smaller than diffusion depth D3 of N-type impurity region 12a. Particularly, N-type impurity regions 22 and 25 may be formed in the same step. In this case, diffusion depths D2 and D4 are equal to each other as shown in FIG. 10, and distance D1 can be accurately defined by a mask that is used for forming N-type impurity regions 22 and 25.

The structures of the semiconductor device of this embodiment other than the above are substantially the same as those of the semiconductor device of the third embodiment. Therefore, the same members bear the same reference numbers, and description thereof is not repeated.

The semiconductor device of this embodiment can achieve substantially the same effect as the third embodiment. Further, this embodiment can suppress diffusion of the N-type semiconductor regions (N-type impurity regions 12a and 22) electrically connected to drain electrode 24 toward N-type impurity region 12b because diffusion depth D4 of N-type impurity region 22 is smaller than diffusion depth D3 of N-type impurity region 12a. Therefore, this embodiment can reduce the footprint of the N-type semiconductor region electrically connected to drain electrode 24, and can further reduce the footprint of the semiconductor device.

(Seventh Embodiment)

Figure 11:
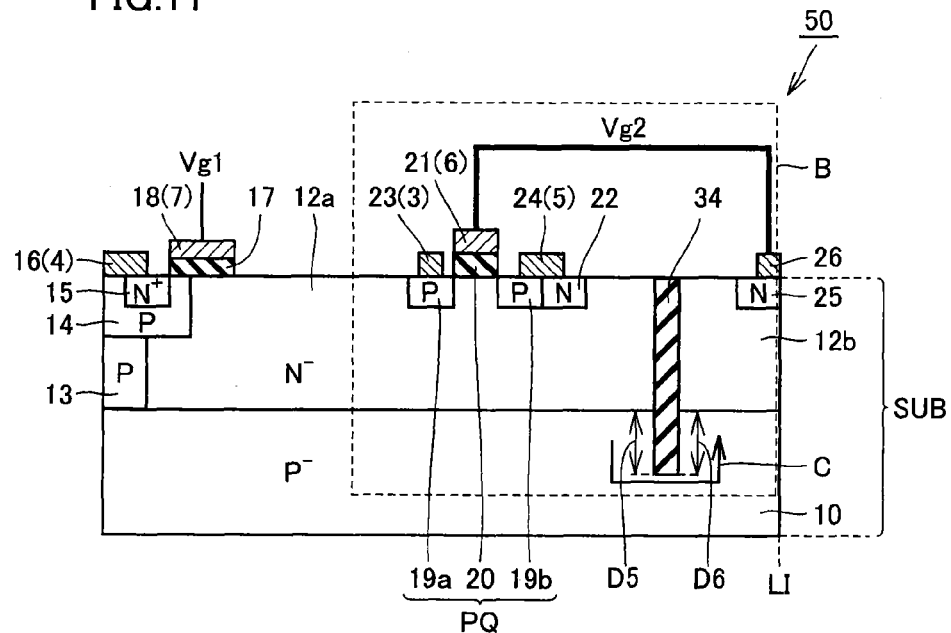

Referring to FIG. 11, the semiconductor device of this embodiment differs from the semiconductor device of the first embodiment shown in FIG. 3 in that an insulating film 34 isolating N-type impurity regions 12a and 12b from each other is formed in semiconductor substrate SUB in place of electrode 27 and insulating film 28 (FIG. 3). Insulating film 34 extends downward from the surface of semiconductor substrate SUB, and reaches P-type semiconductor region 10 located under N-type impurity regions 12a and 12b.

The structures of the semiconductor device of this embodiment other than the above are substantially the same as those of the semiconductor device of the first embodiment. Therefore, the same members bear the same reference numbers, and description thereof is not repeated.

In the semiconductor device of the embodiment, insulating film 34 isolates N-type impurity regions 12a and 12b from each other. Therefore, when the punch through breakdown occurs between N-type impurity regions 12a and 12b, the depletion layer at the boundary between N-type impurity region 12a and P-type semiconductor region 10 must extend around the lower end of insulating film 34 to N-type impurity region 12b as indicated by an arrow C in FIG. 11. Thus, distance D1 defining the punch through voltage becomes equal to a sum (D5 +D6) of a distance D5 from the lower end of N-type impurity region 12a to the lower end of insulating film 34 and a distance D6 from the lower end of N-type impurity region 12b to the lower end of insulating film 34. Thereby, it is possible to reduce the distance between N-type impurity regions 12a and 12b while maintaining the punch through voltage between N-type impurity regions 12a and 12b, and to reduce the element footprint while maintaining the characteristics. Consequently, the effect similar to that of the first embodiment can be achieved.

(Eighth Embodiment)

Figure 12:
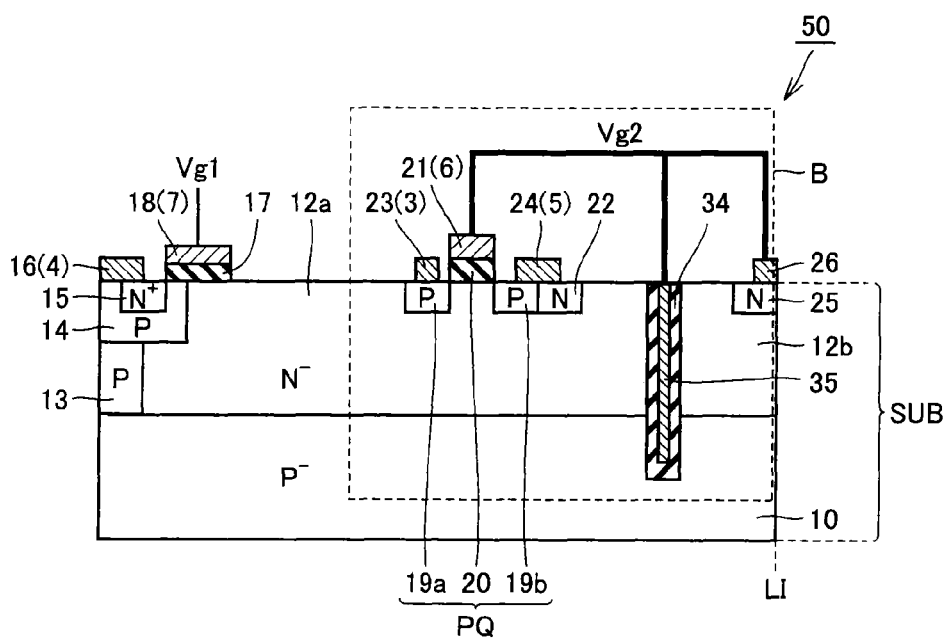

Referring to FIG. 12, the semiconductor device of this embodiment differs from the semiconductor device of the seventh embodiment shown in FIG. 11 in that an embedded electrode 35 is formed. Embedded electrode 35 is embedded in insulating film 34, and is electrically connected to gate electrode 21. Thereby, embedded electrode 35 is isolated from N-type impurity regions 12a and 12b. Embedded electrode 35 preferably extends downward in FIG. 12 beyond the boundary between P-type semiconductor region 10 and N-type impurity region 12a.

The structures of the semiconductor device of this embodiment other than the above are substantially the same as those of the semiconductor device of the seventh embodiment. Therefore, the same members bear the same reference numbers, and description thereof is not repeated.

The semiconductor device of this embodiment can achieve substantially the same effect as that of the seventh embodiment. Further, when the IGBT is off, the potential of embedded electrode 35 is equal to gate potential Vg2, and is at the voltage level intermediate between emitter potential Ve and collector potential Vc. When embedded electrode 35 having the above potential applies the electric field into semiconductor substrate SUB, the extension of the depletion layer at the boundary between N-type impurity region 12a and P-type semiconductor region 10 is suppressed within semiconductor substrate SUB. Consequently, the punch through voltage between N-type impurity regions 12a and 12b can be improved.

The structures in the first to eighth embodiments already described can be appropriately combined together. More specifically, electrode 27 and insulating film 28 in the semiconductor device shown in FIG. 3 may be added to the structures of the semiconductor devices shown in FIGS. 6 to 10.

In general, the invention can be applied to the semiconductor device performing the power switching, and thereby can implement the semiconductor device that performs the fast switching operation with good breakdown characteristics, operates with the low on-state voltage and requires the small footprint. The semiconductor device may be a single discrete transistor, and may also be incorporated in an integrated circuit device such as a module.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
a semiconductor substrate;
a first semiconductor region of a first conductivity type formed in said semiconductor substrate;
an MOS transistor of the first conductivity type formed at a surface of said semiconductor substrate,
said MOS transistor of the first conductivity type including a gate electrode, a source electrode, a drain electrode, a second semiconductor region of a second conductivity type having a channel formed by a potential difference between said gate electrode and said source electrode, formed in said first semiconductor region and electrically connected to said drain electrode, a third semiconductor region of the first conductivity type formed in said second semiconductor region and electrically connected to said source electrode, and a fourth semiconductor region of the first conductivity type formed in said second semiconductor region and electrically connected to said drain electrode; and
a fifth semiconductor region of the second conductivity type formed in said first semiconductor region, opposed to said second semiconductor region with said first semiconductor region therebetween and electrically connected to said gate electrode, wherein
each of said second and fifth semiconductor regions is formed by implanting the impurities, and a diffusion depth of said fifth semiconductor region is smaller than a diffusion depth of said second semiconductor region.

2. The semiconductor device according to claim 1, further comprising:

a bipolar transistor including a first conductive node electrically connected to said source electrode of said MOS transistor of the first conductivity type, a second conductive node connected to an electrode node and a base node electrically connected to said drain electrode of said MOS transistor of the first conductivity type;

an MOS transistor of the second conductivity type connected between said electrode node and said base node of said bipolar transistor, and being selectively turned on according to a control signal to connect electrically said electrode node to said base node of said bipolar transistor; and a PN junction diode having a cathode electrically connected to a gate electrode of said MOS transistor of the first conductivity type and an anode electrically connected to said electrode node.

* * * * *